United States Patent
Venkatesha Rao et al.

(10) Patent No.: US 7,739,119 B2
(45) Date of Patent: Jun. 15, 2010

(54) TECHNIQUE FOR IMPLEMENTING HUFFMAN DECODING

(75) Inventors: Anil Kumar Agara Venkatesha Rao, Karnataka (IN); Preethi Konda, Karnataka (IN)

(73) Assignee: Ittiam Systems (P) Ltd., Bangalore, Karnataka (IN)

( * ) Notice: Subject to any disclaimer, the term of this patent is extended or adjusted under 35 U.S.C. 154(b) by 1048 days.

(21) Appl. No.: 11/059,595

(22) Filed: Feb. 16, 2005

(65) Prior Publication Data

US 2005/0200505 A1 Sep. 15, 2005

Related U.S. Application Data

(60) Provisional application No. 60/549,616, filed on Mar. 2, 2004.

(51) Int. Cl.
*G10L 19/00* (2006.01)
*H03M 7/40* (2006.01)

(52) U.S. Cl. .................... 704/500; 704/201; 341/65

(58) Field of Classification Search .................. None
See application file for complete search history.

(56) References Cited

U.S. PATENT DOCUMENTS 6,903,669 B1 *  6/2005  Subramaniam ............. 341/106
2007/0057825 A1 *  3/2007  De Martin et al. ............ 341/67

* cited by examiner

*Primary Examiner*—Angela A Armstrong
(74) *Attorney, Agent, or Firm*—Prakash Nama; Global IP Services, PLLC

(57) ABSTRACT

An improved decoding process as applied to MPEG AAC decoders of the type that use codebooks, reduces redundant traversing steps while finding the location of a specific binary stream codeword in the codebook. To this end, the codebooks are divided into a plurality of node-tables, each table corresponding to a node. From the number of bits "k" in a given node-table, the decimal value of the first "k" bits in a binary stream to be decoded is ascertained and compared with the decimal value of the maximum code word in the given node-table. The comparison is used for the identification of the location of the codeword in the node-tables to assist in decoding without unnecessary traversing of all the nodes in the codebook.

21 Claims, 3 Drawing Sheets

TECHNIQUE FOR IMPLEMENTING HUFFMAN DECODING

RELATED APPLICATIONS

Benefit is claimed under 35 U.S.C. 119(e) to U.S. Provisional Application Ser. No. 60/549,616, entitled "Novel Technique for Implementing Huffman Decoding in MPEG-2/4 AAC Decoders" by Kumar et al., filed Mar. 2, 2004, which is herein incorporated in its entirety by reference for all purposes.

FIELD OF THE INVENTION

This invention generally relates to a technique for implementing Huffman decoding and more particularly to a technique for implementing MPEG-AAC (Moving Picture Experts Group-Advanced Audio Coding) related decoding.

BACKGROUND OF THE INVENTION

MPEG is associated with a family of standards used for coding audio-visual information (e.g., movies, video, and music) in a digital compressed format. The major advantage of MPEG compared to other video and audio coding formats is that MPEG files, because of the use of data compression, are much smaller for the same quality. This is because MPEG uses very sophisticated compression techniques that may be loss-less. By assigning smaller codes for more frequently used characters and larger codes for less frequently used characters, a file can be compressed considerably.

AAC is known as a useful state-of-the-art audio compression tool that provides a superior performance. An AAC audio format is known to be used in High Definition Transport Streams in Asia, in QuickTime (iTunes) and in MPEG 4 ISO formats. Currently, at least one commonly known implementation of an AAC decoder is by the Core Codec group.

AAC files can occur internal to Audio/Video formats such as AVI/OGM/Matroska, or as a stand alone Audio file (AAC/M4A). An AAC encoded stream contains spectral values that are quantized using the two parameters, i.e., quantized spectral lines, and scale factor. The scale factor defines the full scale range of the quantization, and the quantized line defines the precision within that scale. The entire frequency region is divided into frequency groups called "scale-factor bands". Each scale-factor band is associated with one scale factor, reflecting the psycho acoustic similarity of the grouped frequencies. The scale-factors are obtained through an iterative procedure in a bit allocation module, and reflect the magnitudes of the spectral coefficients in each scale-factor band. The bit allocation algorithm typically divides the available data bits among various scale-factor bands. Units with a large number of bits may have little quantization noise, and units with few or no bits may have significant amounts of noise. For good sound quality, it is preferred that a bit allocation algorithm should ensure that critical units have sufficient bits, and that the noise in non-critical units is not perceptually significant.

AAC takes advantage of such new tools as temporal noise shaping, backward adaptive linear prediction and enhanced joint stereo coding techniques. For example, AAC supports a wide range of sampling rates (8-96 kHz), bit rates (16-576 kbps) and from one to 48 audio channels. AAC in one form has the ability to use the coding tools already present in MP3, but implements them in a better way using a filter bank which may be a pure MDCT (modified discrete cosine transform) and not a hybrid filter bank, as for example in MP3. AAC in another form also introduces some new tools over previous coding schemes. One such tool is Temporal Noise Shaping (TNS) which is a tool designed to control the location, in time, of the quantization noise by transmission of filtering coefficients. Prediction may be used as a tool designed to enhance compressibility of stationary signals.

It is known that a Huffman binary tree is generated when the coding process is done. For decoding however, the process starts at the root of the Huffman binary tree. When a bit is reached, and depending on whether it is 0 or 1, the decoding process goes to the left or the right respectively. The decoding process may stop when a leaf node is encountered, which contains the symbol to decode.

A Huffman decoder, as known, is a variable length statistical coder. As a result, the encoder does not send the length of each codeword, but rather sends the Huffman tree to which a set of codewords belong to. This makes it very difficult for the decoder, as it has to step through each of the nodes of the Huffman tree, searching for the leaf node. Each node can in turn have multiple leaf nodes, which makes it even more MIPS intensive for the decoder to corner down to a single leaf node. Since the Huffman code length is not fixed, typically the decoder has to find out the length of each code while processing. In the known Huffman decoding approach, a codebook in the form of code tables including information about the nodes and codewords is generally used for search by traversing. Traversing each of the nodes of the Huffman tree or the codebook for decoding a given codeword is expensive and time consuming. In known decoding methods, there is still the need for too many iterations and traversing operations for decoding a codeword while using code tables.

SUMMARY OF THE INVENTION

One embodiment of the invention provides a method of implementing Huffman decoding for decoding a given binary codeword using a codebook, comprising the steps of: sub-dividing the codebook into node-tables, each node-table including codewords containing a known number of bits 'k'; ascertaining a first decimal value of a highest codeword in a chosen node-table; calculating a second decimal value of 'k' number initial bits said given binary codeword to be decoded: and, identifying, using a difference between said second decimal value and said first decimal value, a location for said given binary codeword with respect to said chosen node-table. The present method of implementing Huffman decoding is applicable to systems and articles that use the present modified decoding approach.

A second embodiment of the invention resides in a method for implementing a decoding process in a Huffman decoder, comprising: using a codebook that lists a plurality of nodes and a plurality of codewords under each said node, for knowing a position of a given codeword in said list and for decoding said given codeword, said codeword having an encoded bit stream and a most significant bit (MSB), said method further comprising the steps of: sub-dividing said codebook into a plurality of node-tables, each node-table corresponding to one said node, each said node-table including a plurality of codewords which are in increasing decimal value order till the last one that is the highest codeword in a respective node-table, codewords of lower decimal value being placed below codewords of higher decimal values within each node-table; ascertaining a number of bits "k" in a given node-table; ascertaining a first decimal value of "k" bits from said given codeword, the "k" bits being reckoned from the MSB of said encoded bit stream; ascertaining a second decimal value of the highest codeword in said given node-table; calculating a numerical difference between said second decimal value and said first decimal value as an integer "p"; and, identifying a position for said given codeword as a location-position which is "p" lines from a starting codeword in said given node.

The decoding process in another form resides in a technique for implementing a Huffman decoder, comprising using codebooks that list a plurality of nodes each including corresponding codewords, said decoding process being adapted for decoding a given binary codeword having a known bit-stream, without having to traverse all of said plurality of nodes, said decoding process further comprising the steps of: sub-dividing said codebook into a plurality of node-tables, each node-table corresponding to one said node, each said node-table including a plurality of codewords which are in increasing decimal-value order till the last one that is the highest codeword in a respective node-table, codewords of lower decimal value being placed below codewords of higher decimal values within each node-table; starting with said known codeword bit stream, and ascertaining a number if "1"s at a left end of said bit stream that is also the end of the most significant bits (MSBs), comparing the ascertained number of "1"s with said codebooks a node-table N1 for identifying a node-table that has codewords with the ascertained number of "1"s at the MSB end; ascertaining a number of bits "k1" in codewords of said code table N1; reading an initial k1 bits from said known bit stream to obtain a codeword value cw from said given codebooks; ascertain a value cw1 of a maximum codeword from said node-table N1; if cw1>=cw, then concluding that the given codeword will be in node N1; and, if cw>cw1, then concluding that the codeword is in a node higher than the node N1.

In a specific application, the decoding process resides in a modified Huffman decoding process for use in advanced audio code (AAC) decoding for decoding a given binary codeword, comprising: referring to a codebook that lists a plurality of nodes with binary codewords in increasing order with known corresponding decimal values; sub-dividing said codebook into a plurality of node-tables, each node-table corresponding to one said node, each said node-table including a plurality of codewords which are in increasing decimal-value order till the last one that is the highest codeword in a respective node-table, codewords of lower decimal value being placed below codewords of higher decimal values within each node-table; starting with a given codeword to be decoded, said given codeword being identified by a known encoded stream having a left side that starts with most significant bits (MSBs); reading at least sixteen initial bits from said known encoded stream by starting from and including said MSBs to obtain a read-value; keeping said read-value right-justified in a 32 bit register and padding said MSBs with leading "1"s; ascertaining how many "1"s were padded in order to keep said read-value right-justified in said 32 bit register; from said ascertained number of padded "1"s, deciding possible node locations where said given binary codeword might reside; and, traversing said possible node locations to decode said given binary codeword.

It is understood that modifications in the process steps of the decoding process as depicted above are possible without departing from the thrust of the described process and are within the ambit of the present invention. It is also to be understood that acronyms used in the claims should be understood as explained in the text.

BRIEF DESCRIPTION OF THE DRAWING

Embodiments of the invention will now be described, by way of example only, with reference to the accompanying drawings in which.

DETAILED DESCRIPTION OF THE INVENTION

In the following detailed description of the various embodiments of the invention, reference is made to the accompanying drawings that form a part hereof, and in which are shown by way of illustration, specific embodiments in which the invention may be practiced. These embodiments are described in sufficient detail to enable those skilled in the art to practice the invention, and it is to be understood that other embodiments may be utilized and that changes may be made without departing from the scope of the present invention. The following detailed description is therefore not to be taken in a limiting sense, and the scope of the present invention is defined by the appended claims.

The present invention provides a technique for the implementation of the Huffman decoding process that enables decoding a given binary stream of a codeword by a method that is less search-intensive than known methods. Decoding as described hereinafter using the technique may be done by using a codebook without having to traverse the codebook in its entirety. The present decoding implementation process reduces disadvantages of intensive decoding steps that are commonly accepted as inevitable in known decoding methods.

The present decoding process may be used without limitation in MPEG-2 and MPEG-4 AAC applications, as also in the context of MP3. Even though the present decoding process is explained hereinafter in the context of MPEG AAC decoders, it is envisaged that the decoding process may be applied to other scenarios also, where several wasteful iterations are generally performed by traversing code tables in their entirety for decoding a given binary stream of a codeword.

Figure 1:
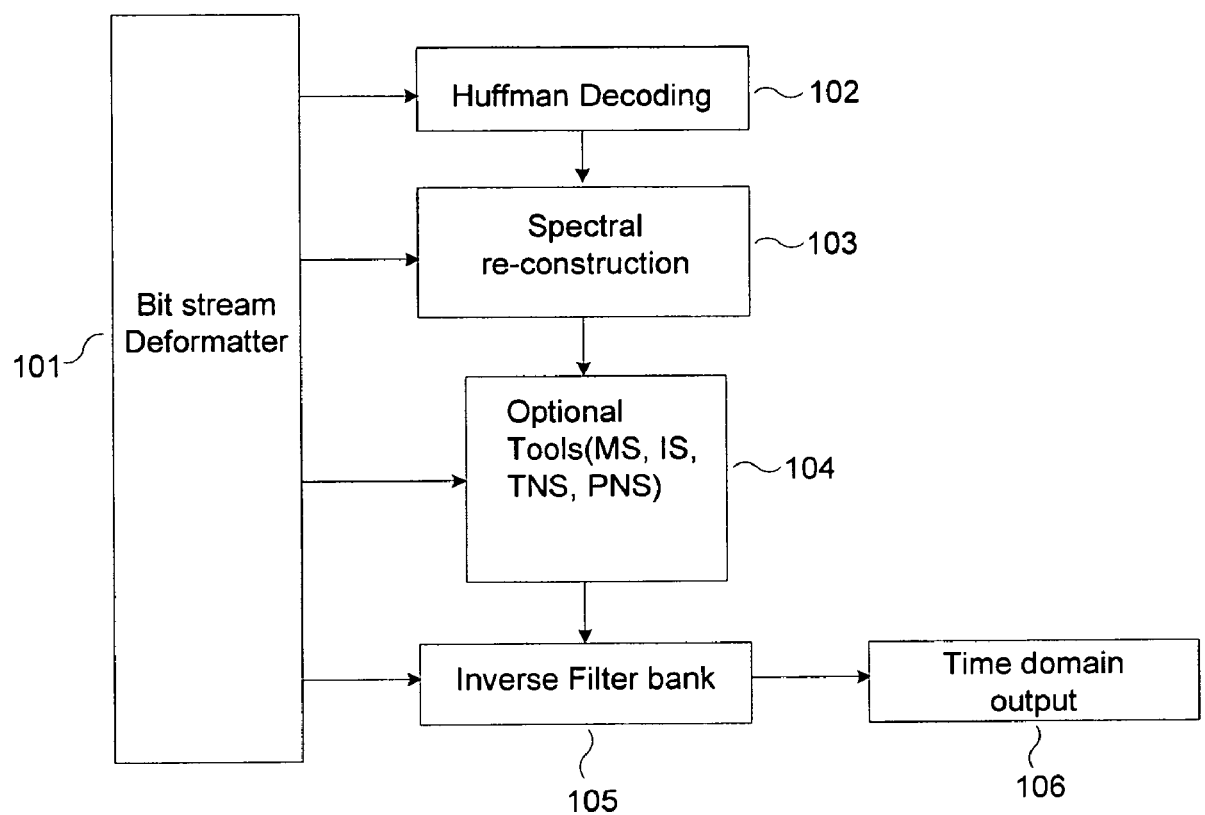
FIG. 1 illustrates a perceptual AAC decoder according to an embodiment of the present subject matter; and, FIG. 2 shows an exemplary flow diagram of a process for decoding a given binary codeword using the present implementation technique; and, FIG. 3 is a block diagram of a typical computer system used for implementing embodiments of the present subject matter, such as those shown in FIGS. 1 and 2.

FIG. 1 illustrates the schematic of a perceptual audio decoder that has application in an AAC decoder. FIG. 1 generally shows the flow of coded input that is processed to result in a decoded output, and shows a bit stream deformatter 101 that feeds into the Huffman decoding block 102. As shown, the information that is initially decoded is subjected to spectral re-construction in block 103 to provide an output to an inverse filter bank 105. Certain optional tools may be employed to additionally process or otherwise modify the output from the spectral re-construction block 103. The optional tools may be Mid-side (MS) and Intensity Stereo (IS) coding, TNS (temporal noise shaping) or PNS (perceptual noise substitution), and can be extended to other information processing tools without limitation. The inverse filter bank provides its output to the time domain output in block 106.

In the decoder illustrated in FIG. 1, there may be generally three important functions as listed below:
1. Noiseless Decoding: Noiseless decoding is done in order to get the quantized spectral coefficients from the bitstream. In case of AAC or MP3, the noiseless decoding tool used may be a Huffman decoder.
2. Inverse Quantization: The inverse quantization module de-quantizes the quantized coefficients to actual spectral lines.
3. Inverse Filter bank: This may be the last stage of the decoder, where the frequency-to-time translation takes place through a filter bank comprising of IMDCT (inverse modified discrete cosine transform).

In a typical decoder, the MIPS distribution on typical DSP (Digital Signal Processor) may be as follows: Inverse filter bank, being the most MAC (multiply and accumulate) intensive module, takes about 45% of the distribution. Inverse quantization, being the least MAC intensive step, takes around 5%-8% of the distribution. Huffman decoding, being very intensive in control code, takes around 30%-40% of the distribution and increases with the bit-rate.

Since the Inverse Filter bank is a very MAC intensive unit, it can be very easily hand-coded on a typical DSP to give a huge reduction in MIPS. However, since Huffman decoding is mostly control code, the optimization obtained through hand coding on most processors is minimal. As a result, it needs to be addressed at an algorithmic level than hand-coding.

TABLE 1

Part of Codebook 1 in AAC decoder

| Code word (binary values) | Code word (decimal values) | Length | |
|---|---|---|---|
| 0 | 0 | 1 | Node 1 |
| 1 0000 | 16 | 5 | |
| 1 0001 | 17 | 5 | |
| 1 0010 | 18 | 5 | |
| 1 0011 | 19 | 5 | Node 2 |
| 1 0100 | 20 | 5 | |
| 1 0101 | 21 | 5 | |
| 1 0110 | 22 | 5 | |
| 1 0111 | 23 | 5 | |
| 110 0000 | 96 | 7 | |
| 110 0001 | 97 | 7 | |
| 110 0010 | 98 | 7 | |
| 110 0011 | 99 | 7 | |
| 110 0100 | 100 | 7 | |
| 110 0101 | 101 | 7 | |
| 110 0110 | 102 | 7 | |
| 110 0111 | 103 | 7 | |
| 110 1000 | 104 | 7 | |
| 110 1001 | 105 | 7 | |
| 110 1010 | 106 | 7 | |
| 110 1011 | 107 | 7 | |
| 110 1100 | 108 | 7 | Node 3 |
| 110 1101 | 109 | 7 | |
| 110 1110 | 110 | 7 | |
| 110 1111 | 111 | 7 | |
| 111 0000 | 112 | 7 | |
| 111 0001 | 113 | 7 | |
| 111 0010 | 114 | 7 | |
| 111 0011 | 115 | 7 | |
| 111 0100 | 116 | 7 | |
| 111 0101 | 117 | 7 | |
| 111 0110 | 118 | 7 | |
| 111 0111 | 119 | 7 | |
| 11110 0000 | 480 | 9 | |
| 11110 0001 | 481 | 9 | |
| 11110 0010 | 482 | 9 | |
| 11110 0011 | 483 | 9 | |
| 11110 0100 | 484 | 9 | Node 4 |
| 11110 0101 | 485 | 9 | |
| 11110 0110 | 486 | 9 | |
| 11110 0111 | 487 | 9 | |
| 11110 1000 | 488 | 9 | |

Table 1 shows part of a codebook 1 in an AAC decoder as an example and lists binary codeword streams and corresponding decimal values for node 1, node 2, node 3, node 4, and other higher nodes. A typical prior art decoding strategy and the complexity of the solution are first explained. In the subsequent passages, for comparison, a systematic description of the optimizations performed using the implementation of the present decoding process is given. For ease of understanding, as shown in Table 1, the codeword values of the codebook have been expressed in both binary and decimal formats. Compared to known methods of the decoding approach, the present implementation is able to complete decoding of a given binary stream using fewer iterations and skipping redundant traverses of the code table that could not be avoided in the known methods.

The technique of implementing the Huffman decoding will now be explained by taking an example. Consider the following encoded stream 11100101011 . . . . Since the encoder does not send the codeword length, the decoder has to search through the codebook for each value to arrive at the final codeword. The decoder first starts with Node 1. Since the length of Node 1 is 1 bit, the decoder gets the first bit from the stream. This happens to be '1'. It then compares it with the codeword at Node 1, namely '0'. Since the two do not match, the decoder moves on to the next node. The next node is Node 2, which has codewords of length 5 bits stored. Then, the decoder gets the next 4 bits from the stream, and places the bits next to the first bit previously obtained, to construct the new codeword '11100' from the stream. It then searches through all the 5 bit codewords in node 2 to find a match. Since none of the codewords in Node 2 match, the decoder now moves on to Node 3. It reads two more bits from the stream to form the codeword '1110010'. It now searches through the Node 3 until it arrives at the matching codeword (114), which is at the 19th position of Node 3.

The above procedure is rather laborious and hence highly MIPS (millions of instructions per second) intensive. Furthermore, the MIPS consumed increase a) with the length of the codeword, and b) if the codeword is situated farther from the start of the node (larger values for a given length).

The following at least three observations assist in the present implementation of the decoding process and may be inferred from the Huffman tables in AAC decoder:
  i. All the codewords in a node are in an increasing order with a difference of 1.
  ii. The number of starting '1's in node N is always greater than or equal to the starting number of '1's in the previous node N−1.
  iii. The largest codeword in a Node N−1, which has 'k' bits, is always less than the value formed using the first 'k' bits of the smallest codeword in subsequent node N.

To make point iii clear, an example of the largest codeword in Node 3 is taken together with the smallest codeword in Node 4. Node 3 has codewords of length 7-bits. The largest of them is 119 or '1110111'. The smallest codeword in Node 4 is 480 or '111100000'. The first 7-bits of 480 are '1111000' or 120. Clearly, 120 is larger than 119. This property observed in decoders, especially in AAC applications, is very useful in the implementations that the invention provides.

The following steps are illustrative of how the improved decoding approach in the present implementation serves to reduce wasteful traversing of the codebook, and cuts short the processing time significantly.

Step 1: The first step of the implementation comes from observation i.). The codebooks are expediently divided into different tables, each table consisting of a single node. Further, the tables are arranged in descending order of codewords. Now, if somehow the exact node (of say 'k' bits) where the codeword existed is known, it is simply possible to subtract the decimal value formed using the first 'k' bits of the bit stream from the highest decimal value in that node. The resulting value directly gives the index or the distance of the actual codeword binary stream from the start of the node. In order to clarify the inventive implementation further, an example of the encoded stream 11100101011 . . . is taken. It is further assumed that it is known that the codeword exists in Node 3 which has 7-bit codeword stored. The decimal value of the first seven bits from the stream is '1110010' or 114. The maximum value in Node 3 is 119. Subtracting the two, the result is 5. The codeword happens to be 5 values from 119 (119 excluded) or, the actual codeword is in node 3, which is the fifth location from 119.

Step 2: In step 1 above, it was assumed that the node in which the codeword exists is somehow known. However, since the encoder does not send the number of bits for a particular codeword, the number is not known upfront. In a conventional decoder, it is possible to get to a correct node only by traversing through all the nodes. Step 2 describes in detail, as to how to reach the exact node in which a codeword exists without having to traverse through all the nodes.

This step is a direct consequence of the observations ii and iii listed supra. From observation ii, by knowing the number of leading '1's in a codeword, one can state that the codeword belongs to a specific group of nodes. This group of nodes is on an average 2, and at max 4 in AAC, and includes consecutive nodes. As a result, the search has been minimized to just 2 nodes from an average of 6-7 nodes.

Once the group is found, the exact codeword is tracked in five steps (average). In an AAC decoder, in one application, the highest number of bits any codeword can get is 16 (vide: Codebook 3, value 65535. Codebook 3 is the third codebook in Huffman tables in the AAC standard 14496-3). In such a scenario, the following steps may be implemented:

A. Read at least 16 bits from the encoded stream.
B. Keep the value right-justified in a 32 bit register, and pad the MSBs with leading '1's. It is to be noted that
  (a) The 16-bit value will be automatically right-justified if it is copied to a 32-bit variable.
  (b) It is possible to pad the number with '1's bit-wise 'OR'ing it with 0xffff0000.
  (c) If val is a 16-bit number and wVal is a 32-bit number, the following is done:
wVal=val; wVal=wVal|0xffff0000.
C Take the 'Norm' of the value, which will give the number of redundant sign bits (in this case '1's) or in effect, P–1 leading '1's. Knowing how many '1's were padded, one can know the leading '1's of the codeword. This will lead to a set of nodes the codeword can belong to.
D The smaller numbered node N1 will have '$k_1$' bit codewords stored, while the other; N2 will have '$k_2$' bit codewords stored, with $k_1<k_2$.
E Read $k_1$ bits from the stream to get a value 'cw'. Compare the value 'cw' with the maximum codeword cw1 in Node N1. If the value 'cw' is less than or equal to cw1, then the actual codeword exists in N1. The actual codeword can be obtained from N1 using Step 1. Otherwise, the codeword lies in N2 and can again be obtained by following Step 1.

Again, the example of the encoded stream 111001010 11 . . . is considered. By using steps A, B and C, it is known that there are three leading '1's in the codeword. This directly leads to node 3. In this case, the set of nodes consists of only one node. Hence, steps D and E are skipped, and Step 1 is directly used to get to the codeword 114. Thus, redundant traversing of some of all the nodes is obviated, resulting in efficiency from the point of view of time and resources.

Figure 2:
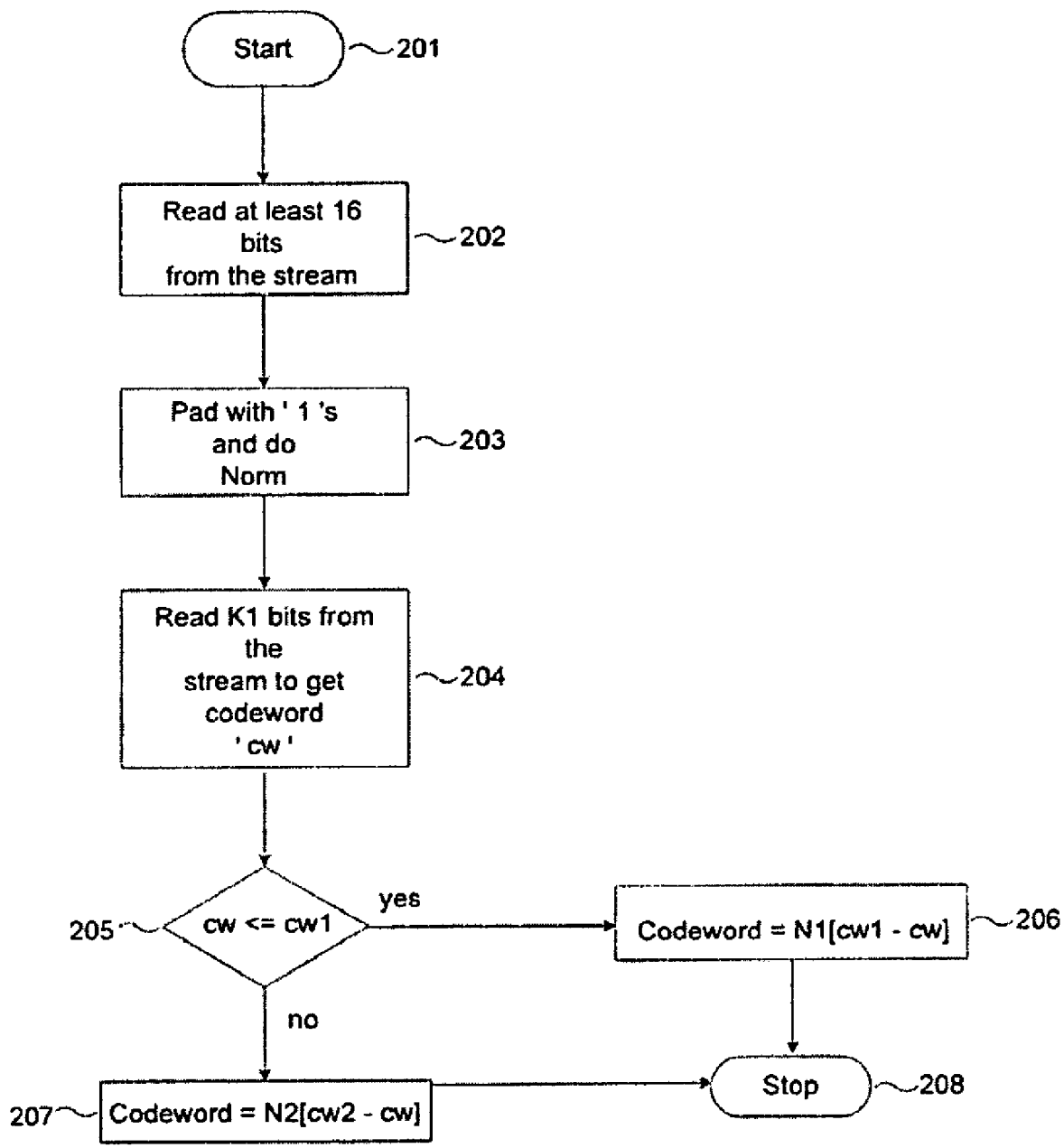

An exemplary flowchart of the above algorithm where k is 16 is shown in FIG. 2. The flow chart in FIG. 2 includes the steps 201 for start, step 202 for reading at least 16 bits from the binary stream, step 203 for padding with "1"s, and taking the Norm of the value, step 204 for reading $k_1$ bits from the stream to get codeword "cw", (where $cw_1$ is the maximum codeword from node N1), step 205 for ascertaining if cw<=cw1, then concluding that the codeword is in node N1, if not, (i.e., if cw>cw1) step 207 for indicating that the codeword in question is in node N2, with the iteration stopping at step 208. For some codebooks (ex: book2), the number of nodes containing same number of leading '1's is 4. This raises the search of a particular node (step 2: B) to 4 nodes. Hence, for such cases, one might apply a loop instead of a simple if/else criterion.

Various embodiments of the present subject matter can be implemented in software, which may be run in the environment shown in FIG. 3 (to be described below) or in any other suitable computing environment. The embodiments of the present subject matter are operable in a number of general-purpose or special-purpose computing environments. Some computing environments include personal computers, general-purpose computers, server computers, hand-held devices (including, but not limited to, telephones and personal digital assistants (PDAs of all types), laptop devices, multi-processors, microprocessors, set-top boxes, programmable consumer electronics, network computers, minicomputers, mainframe computers, distributed computing environments and the like to execute code stored on a computer-readable medium. The embodiments of the present subject matter may be implemented in part or in whole as machine-executable instructions, such as program modules that are executed by a computer. Generally, program modules include routines, programs, objects, components, data structures, and the like to perform particular tasks or to implement particular abstract data types. In a distributed computing environment, program modules may be located in local or remote storage devices.

Figure 3:
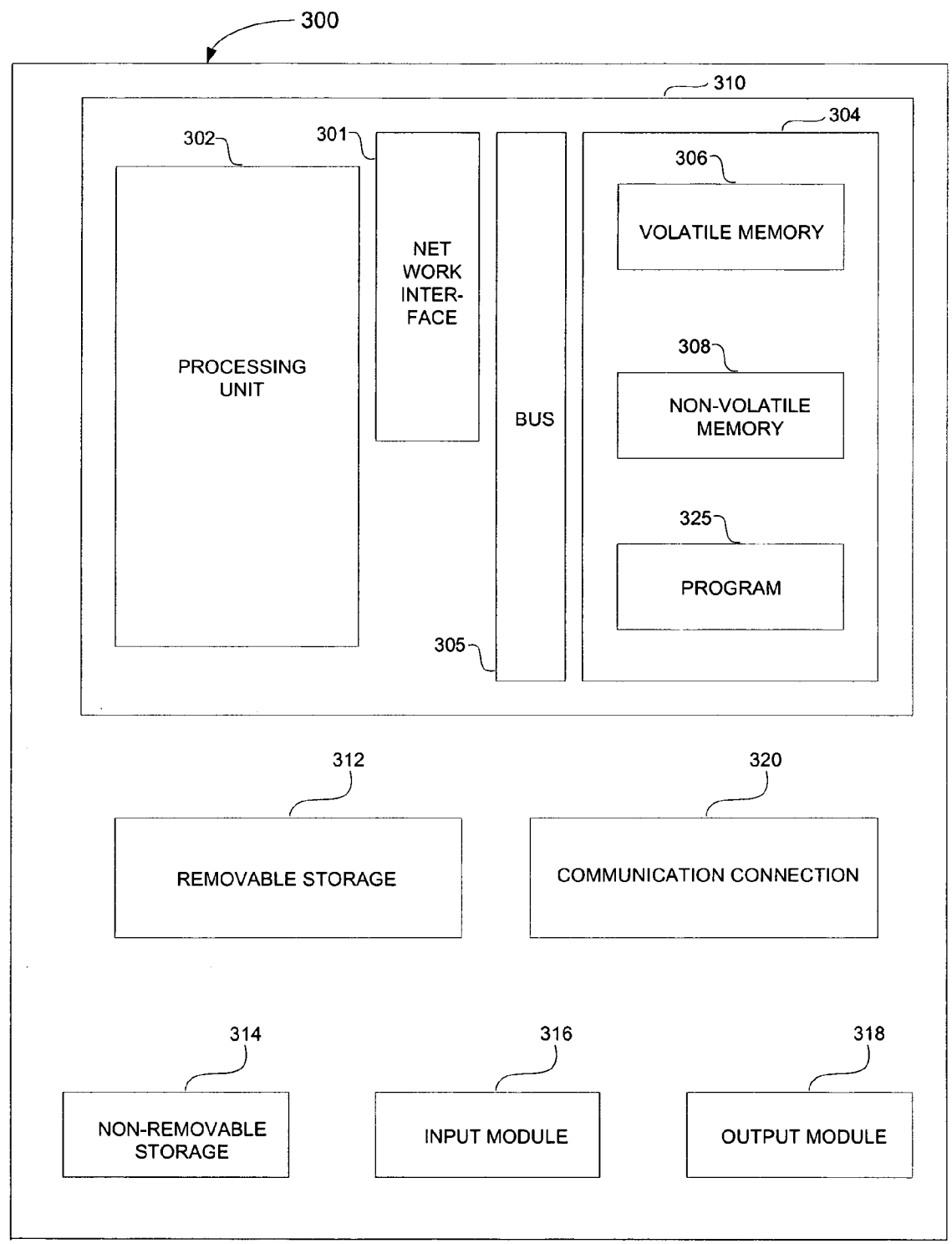

FIG. 3 shows an example of a suitable computing system environment for implementing embodiments of the present subject matter. FIG. 3 and the following discussion are intended to provide a brief, general description of a suitable computing environment in which certain embodiments of the inventive concepts contained herein may be implemented.

A general computing device in the form of a computer 310 may include a processing unit 302, memory 304, removable storage 312, and non-removable storage 314. Computer 310 additionally includes a bus 305 and a network interface (NI) 301.

Computer 310 may include or have access to a computing environment that includes one or more user input devices 316, one or more output devices 318, and one or more communication connections 320 such as a network interface card or a USB connection. The one or more user input devices 316 can be a touch screen and a stylus and the like. The one or more output devices 318 can be a display device of computer, computer monitor, TV screen, plasma display, LCD display, display on a touch screen, display on an electronic tablet, and the like. The computer 310 may operate in a networked environment using the communication connection 320 to connect to one or more remote computers. A remote computer may include a personal computer, server, router, network PC, a peer device or other network node, and/or the like. The communication connection may include a Local Area Network (LAN), a Wide Area Network (WAN), and/or other networks.

The memory 304 may include volatile memory 306 and non-volatile memory 308. A variety of computer-readable media may be stored in and accessed from the memory elements of computer 310, such as volatile memory 306 and non-volatile memory 308, removable storage 301 and non-removable storage 314. Computer memory elements can include any suitable memory device(s) for storing data and machine-readable instructions, such as read only memory (ROM), random access memory (RAM), erasable programmable read only memory (EPROM), electrically erasable programmable read only memory (EEPROM), hard drive, removable media drive for handling compact disks (CDs), digital video disks (DVDs), diskettes, magnetic tape cartridges, memory cards, Memory Sticks™, and the like; chemical storage; biological storage; and other types of data storage.

"Processor" or "processing unit," as used herein, means any type of computational circuit, such as, but not limited to, a microprocessor, a microcontroller, a complex instruction set computing (CISC) microprocessor, a reduced instruction set computing (RISC) microprocessor, a very long instruction word (VLIW) microprocessor, explicitly parallel instruction computing (EPIC) microprocessor, a graphics processor, a digital signal processor, or any other type of processor or processing circuit. The term also includes embedded controllers, such as generic or programmable logic devices or arrays, application specific integrated circuits, single-chip computers, smart cards, and the like.

Embodiments of the present subject matter may be implemented in conjunction with program modules, including functions, procedures, data structures, application programs, etc., for performing tasks, or defining abstract data types or low-level hardware contexts.

Machine-readable instructions stored on any of the above-mentioned storage media are executable by the processing unit 302 of the computer 310. For example, a computer program 325 may include machine-readable instructions capable of implementing Huffman decoding according to the teachings and herein described embodiments of the present subject matter. In one embodiment, the computer program 325 may be included on a CD-ROM and loaded from the CD-ROM to a hard drive in non-volatile memory 308. The machine-readable instructions cause the computer 310 to encode according to the various embodiments of the present subject matter.

The foregoing is the description of an exemplary implementation of the decoding process performed on Huffman Decoding, in the context of MPEG-2/4 AAC audio decoders. A similar implementation is applicable without limitation, to other decoders as well, including MP3 decoders.

The above-described implementation provides an improved process for decoding binary coded streams, wherein certain traversing steps from the codebook are obviated. The improved decoding process is described hereinabove in the context of MPEG AAC decoders only as an example. The description hereinabove is intended to be illustrative, and not restrictive. It is to be noted that the above-described implementation reduces MIPS intensive traversing steps in AAC decoders and similar decoding related applications without limitation. This is achieved for example by eliminating redundant traversing steps while finding the location of a coded word in a specific node-table.

The various embodiments of the improved decoding process described herein are applicable generally to any communication system, and the embodiments described herein are in no way intended to limit the applicability of the invention. In addition, the techniques of the various exemplary embodiments are useful to the design of any hardware implementations of software, firmware, and algorithms in the context of decoding in general. Many other embodiments will be apparent to those skilled in the art. The scope of this invention should therefore be determined by the appended claims as supported by the text, along with the full scope of equivalents to which such claims are entitled.

The invention claimed is:

1. A method of implementing Huffman decoding in a moving picture experts group (MPEG) advanced audio coding (AAC) decoder for decoding a given binary codeword, comprising:
    using a codebook;
    sub-dividing the codebook into node-tables, each node-table including codewords containing a known number of bits;
    in a chosen node table, ascertaining said known number of bits as "k", and ascertaining a first decimal value of a highest codeword, wherein choosing said node table comprises:
        ascertaining a number of "1"s at a left end of said given binary codeword that is also a location of a most significant bit (MSB); and
        comparing the ascertained number of "1"s with said codebook for choosing a node-table that has codewords with said ascertained number of "1"s at the MSB end;
    calculating a second decimal value of 'k' number of initial bits of said given binary codeword to be decoded; and,
    identifying, using a difference between said second decimal value and said first decimal value, a location for said given binary codeword with respect to said chosen node-table.

2. The method as in claim 1, wherein the step of identifying includes:
    calculating a numerical difference between said second decimal value and said first decimal value as an integer "p"; and,
    identifying a position for said given codeword as a location position which is "p" lines away from a starting codeword in said given node.

3. The method as in claim 1 as applied to AAC in the context of an application chosen from a group comprising MPEG 2 and MPEG 4.

4. The method as in claim 3 including the step of using a reconstruction tool chosen from MS (Mid-Side) coding, IS (Intensity Stereo) coding, TNS (Temporal Noise Shaping) and PNS (Perceptual Noise Substitution).

5. An article comprising a storage medium having instructions that when executed by a computing platform, resulting in execution of a method of implementing Huffman decoding in a moving picture experts group (MPEG) advanced audio coding (AAC) decoder, said method comprising:
    using a codebook containing codewords in the form of binary codeword streams;
    sub-dividing the codebook into node-tables, each node-table including codewords containing a known number of bits 'k';
    ascertaining a first decimal value of a highest codeword in a chosen node-table, wherein choosing said node table comprises:
        ascertaining a number of "1"s at a left end of said given binary codeword that is also a location of a most significant bit (MSB); and
        comparing the ascertained number of "1"s with said codebook for choosing a node-table that has codewords with said ascertained number of "1"s at the MSB end;

calculating a second decimal value of 'k' number of initial bits of said given binary codeword to be decoded; and, identifying, using a difference between said second decimal value and said first decimal value, a location for said given binary codeword with respect to said chosen node-table.

6. The article as in claim 5 for use in advanced audio coding (AAC) in the context of one of MPEG 2, MP3, and MPEG 4.

7. The article as in claim 6 including a reconstruction tool chosen from MS (Mid-Side) coding, IS (Intensity Stereo) coding, TNS (Temporal Noise Shaping) and PNS (Perceptual Noise Substitution).

8. A system comprising:

a receiver for receiving an input coded stream having a plurality of variable length codewords based on a Huffman codebook;

a moving picture experts group (MPEG) advanced audio coding (AAC) Huffman decoder coupled to the receiver; and a memory operatively coupled to the decoder that stores said Huffman codebook, wherein the Huffman decoder computes values of each codeword in the Huffman codebook based on binary streams of the codewords in the Huffman codebook, wherein said memory of the Huffman decoder is programmed for: sub-dividing the codebook into node-tables, each node-table including binary stream codewords containing a known number of bits 'k': ascertaining a first decimal value of a highest codeword in a chosen node-table, wherein choosing said node table comprises:

ascertaining a number of "1"s at a left end of said given binary codeword that is also a location of a most significant bit (MSB); and comparing the ascertained number of "1"s with said codebook for choosing a node-table that has codewords with said ascertained number of "1"s at the MSB end;

calculating a second decimal value of 'k' number of initial bits of said given binary codeword to be decoded; and, identifying, using a difference between said second decimal value and said first decimal value, a location for said given binary codeword with respect to said chosen node-table.

9. The system as in claim 8 as applied to AAC in the context of one of MPEG 2, and MPEG 4.

10. The system as in claim 9 including a reconstruction tool chosen from MS (Mid-Side) coding, IS (Intensity Stereo) coding, TNS (Temporal Noise Shaping) and PNS (Perceptual Noise Substitution).

11. A method for implementing a decoding process in a moving picture experts group (MPEG) advanced audio coding (AAC) Huffman decoder, comprising:

using a codebook that lists a plurality of nodes and codewords under each said node, for knowing a position of a given codeword in said list and for decoding said given codeword, said codeword having an encoded bit stream with its left most bit being a most significant bit (MSB);

sub-dividing said codebook into a plurality of node-tables, each node-table corresponding to one said node, each said node-table including a plurality of codewords which are in increasing decimal value order till the last one that is the highest codeword in a respective node-table, codewords of lower decimal value being placed below codewords of higher decimal values within each node-table;

ascertaining a number of bits "k" in a given node-table;

ascertaining a first decimal value of "k" bits from said given codeword, the "k" bits being reckoned from the MSB of said encoded bit stream;

ascertaining a second decimal value of the highest codeword in said given node-table;

calculating a numerical difference between said second decimal value and said first decimal value as an integer "p"; and, identifying a position for said given codeword as a location position that is "p" lines from a starting codeword in said given node.

12. The method as in claim 11, as applied to advanced audio coding (AAC) for an application selected from a group comprising MPEG-2 AAC, and MPEG-4 AAC.

13. The method as in claim 12, including the step of using an optional reconstruction tool chosen from a group comprising MS (Mid-Side) coding, IS (Intensity Stereo) coding, TNS (Temporal Noise Shaping) and PNS (Perceptual Noise Substitution).

14. A method for modifying a moving picture experts group (MPEG) advanced audio coding (AAC) Huffman decoder, comprising:

using given codebooks that list a plurality of nodes, each node including corresponding codewords;

sub-dividing said codebook into a plurality of node-tables, each node-table corresponding to one said node, each said node-table including a plurality of codewords which are in increasing decimal-value order till the last one that is the highest codeword in a respective node-table, codewords of lower decimal value being placed below codewords of higher decimal values within each node-table;

starting with a known codeword bit stream, and ascertaining a number if "1"s at a left end of said bit stream that is also a location of a most significant bit (MSB), comparing the ascertained number of "1"s with said codebooks a node-table N.sub.1 for identifying a node-table that has codewords with the ascertained number of "1"s at the MSB end;

ascertaining a number of bits "k.sub.1" in codewords of said code table N1;

reading an initial k.sub.1 bits from said known bit stream to obtain a codeword value "cw" from said given codebooks;

ascertaining a value "cw1" of a maximum codeword from said node-table N1;

if cw1>=cw, then concluding that the given codeword will be in node N1; and, if cw1<cw, then concluding that the given codeword is in a node higher than the node N1.

15. The method as in claim 14 wherein "k" is 16, and wherein the method is applied to advanced audio coding (AAC), in the context of an application chosen from MPEG-2 and MPEG-4.

16. The method as in claim 15, including the step of using an optional reconstruction tool chosen from a group comprising MS (Mid-Side) coding, IS (Intensity Stereo) coding, TNS (Temporal Noise Shaping) and PNS (Perceptual Noise Substitution).

17. A modified Huffman decoding process for use in a moving picture experts group (MPEG) advanced audio coding (AAC) decoding for decoding a given binary codeword, comprising:

using a codebook that lists a plurality of nodes with binary codewords in increasing order with known corresponding decimal values;

sub-dividing said codebook into a plurality of node-tables, each node-table corresponding to one said node, each said node-table including a plurality of codewords which are in increasing decimal-value order till the last one that is the highest codeword in a respective node-table, codewords of lower decimal value being placed below codewords of higher decimal values within each node-table;

starting with a given codeword to be decoded, said codeword being identified by a known encoded stream having a left side starting with most significant bits (MSBs);

reading at least sixteen initial bits from said known encoded stream by starting from and including said MSBs to obtain a read-value;

keeping said read-value right-justified in a 32-bit register and padding said MSBs with leading "1"s;

ascertaining number of "1"s in said read-value from number of "1"s;

from said ascertained number of "1"s, deciding possible node locations where said given binary codeword might reside; and, traversing said possible node locations to decode said given binary codeword.

18. The method as in claim 17, for an application chosen from a group comprising MPEG-2 AAC, and MPEG-4 AAC.

19. The method as in claim 18, including the step of using a reconstruction tool chosen from a group comprising MS (Mid-Side) coding, IS (Intensity Stereo) coding, TNS (Temporal Noise Shaping) and PNS (Perceptual Noise Substitution).

20. A moving picture experts group (MPEG) advanced audio coding (AAC) decoder, comprising;
    a bit stream deformatter connected to a Huffman decoding means;
    a spectral reconstruction means connected to both the Huffman decoding means and said bit stream deformatter for de-quantizing quantized coefficients to spectral lines;
    an inverse filter bank connected to receive an output from said spectral re-construction means; and,
    a time domain output means connected to said inverse filter bank and providing a decoded output, wherein, said Huffman decoding means includes a program for implementing a decoding process which uses a codebook that lists a plurality of nodes and codewords under each said node, for knowing a position of a given codeword in said list and for decoding said given codeword, said codeword having an encoded bit stream with its leftmost bit being a most significant bit (MSB), said program including the steps of: sub-dividing said codebook into a plurality of node-tables, each node-table corresponding to one said node, each said node-table including a plurality of codewords which are in increasing decimal value order till the last one that is the highest codeword in a respective node-table, codewords of lower decimal value being placed above codewords of higher decimal values within each node-table;

ascertaining a number of bits "k" in a given node-table;

ascertaining a first decimal value of "k" bits from said given codeword, the "k" bits being reckoned from the MSB of said encoded bit stream;

ascertaining a second decimal value of the highest codeword in said given node-table;

calculating a numerical difference between said second decimal value and said first decimal value as an integer "p"; and, identifying a position for said given codeword as a location position that is "p" lines from a starting codeword in said given node.

21. The MPEG AAC decoder as in claim 20, further including at least one decoding tool selected from a group consisting of MS (Mid-Side) coding, IS (Intensity Stereo) coding, TNS (Temporal Noise Shaping) and PNS (Perceptual Noise Substitution), and connected between said spectral re-construction means and said inverse filter bank means.

* * * * *